United States Patent
Delano

(10) Patent No.: US 6,411,165 B1
(45) Date of Patent: Jun. 25, 2002

(54) ACTIVE COMMON MODE FEEDBACK FOR UNBALANCED INPUT AND FEEDBACK SIGNALS AND METHODS THEREOF

(75) Inventor: Cary L. Delano, Los Altos, CA (US)

(73) Assignee: Tripath Technology, Inc., Santa Clara, CA (US)

( * ) Notice: Subject to any disclaimer, the term of this patent is extended or adjusted under 35 U.S.C. 154(b) by 0 days.

(21) Appl. No.: 09/836,623

(22) Filed: Apr. 16, 2001

Related U.S. Application Data

(60) Provisional application No. 60/197,662, filed on Apr. 17, 2000.

(51) Int. Cl.[7] ............................................. H03F 3/45
(52) U.S. Cl. ........................... 330/258; 330/69; 330/85; 330/259
(58) Field of Search ........................... 330/69, 85, 258, 330/259

(56) References Cited

U.S. PATENT DOCUMENTS

| | | | |
|---|---|---|---|
| 5,703,532 A | * 12/1997 | Shin et al. | ................... 330/253 |
| 6,046,638 A | * 4/2000 | Hogeboom | ................... 330/252 |
| 6,137,362 A | * 10/2000 | Dufossez | ..................... 330/254 |
| 6,150,881 A | * 11/2000 | Lovelace et al. | ........... 330/252 |
| 6,160,446 A | * 12/2000 | Azimi et al. | ................... 330/69 |

OTHER PUBLICATIONS

Su, David K. and Wooley, Bruce A., A CMOS Oversampling D/A Converter with a Current–Mode Semidigital Reconstruction Filter, Dec. 1993, IEEE Journal of Solid–State Circuits, vol. 28, No. 12.

* cited by examiner

*Primary Examiner*—Michael B Shingleton
(74) *Attorney, Agent, or Firm*—Beyer Weaver & Thomas LLP

(57) ABSTRACT

A noise shaped differential amplifier having a reduced common mode signal in accordance with an embodiment of the invention is described. In the described embodiment, the noise shaped differential amplifier includes a noise shaper having a common mode signal controlled by an attenuation operational amplifier that is coupled to a voltage divider circuit and a sense resistor divider. In this arrangement, the attenuation operational amplifier controls a virtual ground applied to the sense resistor divider.

12 Claims, 4 Drawing Sheets

ACTIVE COMMON MODE FEEDBACK FOR UNBALANCED INPUT AND FEEDBACK SIGNALS AND METHODS THEREOF

CROSS REFERENCE TO A RELATED APPLICATION

This application claims benefit of priority under 35 U.S.C. 119(e) of (i) U.S. Provisional Application No. 60/197,662 (Att. Dkt. No. TRIPP024P) filed Apr. 17, 2000 and entitled "ACTIVE COMMON MODE FEEDBACK" which is incorporated by reference in its entirety.

I. FIELD OF THE INVENTION

The present invention relates generally to circuits that include differential amplifiers as well as op amps. Specifically, the invention describes a method for reducing noise and thereby increasing dynamic range of an amplifier by adjusting the common mode of the feedback/input signal.

II. DESCRIPTION OF THE RELATED ART

Since the existence of digital signal processing, A/D converters have been playing a very important role as interfaces between the analog and digital worlds. They perform the digitalization of analog signals at a fixed time period (frequency), i.e., the speed of A/D converters. The fixed time period is generally specified by the application based upon, for example, the Nyquist Sampling Theorem. As well known in the art, the Nyquist Sampling Theorem states that the highest frequency that can be accurately represented without aliasing is one-half of the sampling rate.

Since algorithms can be implemented very inexpensively in the digital domain and if the samples acquired satisfy the Nyquist Sampling Theorem, signals can be reconstructed perfectly after the digital signal processing. Hence, the A/D converter acts as a bridge between two domains and its accuracy is very critical to the performance of the system. In order to maintain optimal accuracy, noise sources must be kept to a minimum.

In this regard an RC integrator (commonly used in sigma-delta A/D converters) that includes a noise shaper that represents a particularly desirable approach for analog circuit design. The noise shaper typically includes CMOS transistors, which forces the input voltage $V_{in}$ to have a voltage swing less than 5 volts. However, it is not uncommon (especially in power applications) for the output voltage $V_{out}$ to be on the order of 50 volts. In power noise shaping processors, the early stages (i.e., which typically include a frequency selective network and/or a comparator) generally operate off of a supply that is less than the 50V power stage. Often 5V or +/−5V is used for these stages. For these applications, an attenuation circuit must be used to reduce the signal swing at the input to less than +/−5V.

For example, FIG. 1 shows an unbalanced output signal 100 from a noise shaped differential amplifier. Unfortunately, however, since a common mode signal is simply a division of the differential signal, a resulting common mode signal component 102 reduces the dynamic range of the amplifier by limiting the lowest allowed gain.

Therefore it would be advantageous to reduce the common mode signal of a noise shaping circuit resulting thereby in a reduced noise component and a concomitant increase in dynamic range.

SUMMARY OF THE INVENTION

The present invention relates to a method and apparatus for reducing the common mode signal of the noise shaping amplifier. In one embodiment, this reduced common mode signal results in a reduced noise component in the overall noise of the noise shaping amplifier and a concomitant increase in dynamic range.

In one aspect, a noise shaped differential amplifier having a reduced common mode signal in accordance with an embodiment of the invention is described. In the described embodiment, the noise shaped differential amplifier includes a noise shaper having a common mode signal controlled by an attenuation operational amplifier that is coupled to a voltage divider circuit and a sense resistor divider. In this arrangement, the attenuation operational amplifier controls a virtual ground applied to the sense resistor divider.

By controlling the virtual ground applied to the sense resistor divider, the attenuation operational amplifier controls the common mode signal of the noise shaping amplifier and allows a lower gain without clipping of internal nodes. In this way, the noise generated by the noise shaping amplifier is substantially reduced. It should noted that the attenuation operational amplifier only controls the voltage divider circuit (which is only operating on the common mode signal) and does not act as an additional source of noise in the noise shaping amplifier.

BRIEF DESCRIPTION OF THE DRAWINGS

The invention, together with further advantages thereof, may best be understood by reference to the following description taken in conjunction with the accompanying drawings in which.

DETAILED DESCRIPTION OF SELECTED EMBODIMENTS

The following description is provided to enable any person skilled in the art to make and use the invention and sets forth the best modes contemplated by the inventor for carrying out the invention. Various modifications, however, will remain readily apparent to those skilled in the art, since the basic principles of the present invention have been defined herein specifically to provide a common mode signal attenuation circuit and methods of use thereof.

Reference will now be made in detail to an embodiment of the invention. An example of the embodiment is illustrated in the accompanying drawings. While the invention will be described in conjunction with an embodiment, it will be understood that it is not intended to limit the invention to one preferred embodiment. To the contrary, it is intended to cover alternatives, modifications, and equivalents as may be included within the spirit and scope of the invention as defined by the appended claims.

Broadly speaking, the invention relates to a common mode signal attenuation circuit and methods of use thereof. In one aspect, a noise shaped differential amplifier having a reduced common mode signal in accordance with an embodiment of the invention is described. In the described embodiment, the noise shaped differential amplifier includes a noise shaper having a common mode signal controlled by an attenuation operational amplifier that is coupled to a voltage divider circuit and a sense resistor divider. In this arrangement, the attenuation operational amplifier controls a virtual ground applied to the sense resistor divider.

By controlling the virtual ground applied to the sense resistor divider, the attenuation operational amplifier controls the common mode signal of the noise shaping amplifier and allows a lower gain without clipping of internal nodes. In this way, the noise generated by the noise shaping amplifier is substantially reduced. It should noted that the attenuation operational amplifier only controls the voltage divider circuit (which is only operating on the common mode signal) and does not act as an additional source of noise in the noise shaping amplifier.

Figure 2:
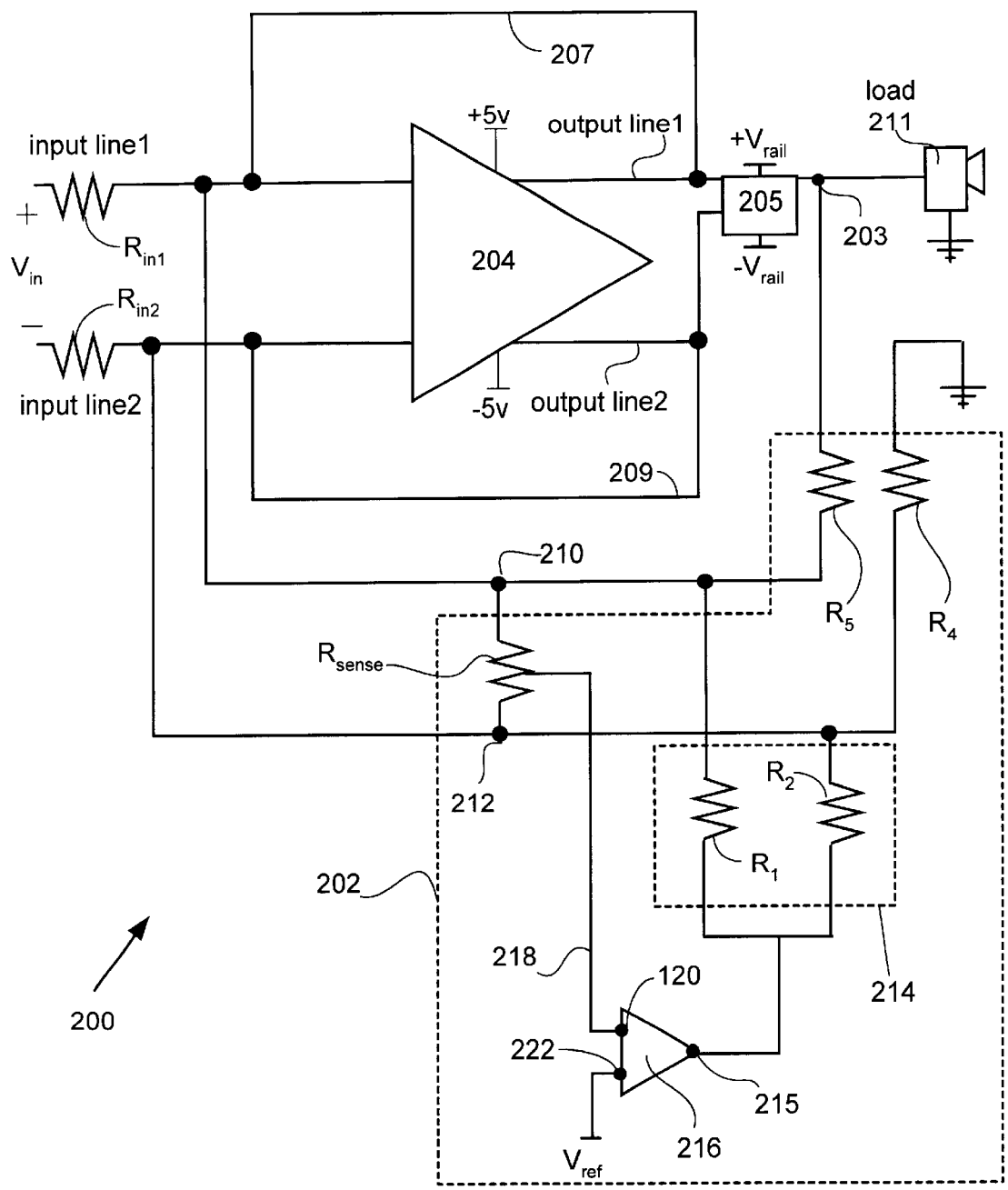
FIG. 2 represents a noise shaped differential amplifier circuit in accordance with an embodiment of the invention.

FIG. 2 represents a noise shaped differential amplifier 200 coupled to an attenuation circuit 202 in accordance with an embodiment of the invention. The noise shaped differential amplifier 200 includes a noise shaper and comparator 204 coupled to an input voltage supply $V_{in}$ by way of input resistors $R_{in1}$ and $R_{in2}$ at an input line1 and an input line2, respectively. The differential amplifier 200 also includes a first feedback path 207 connecting an output line1 to the input line1 and a second feedback path 209 connecting an output line2 to the input line2 where the output line1 and output line2 form inputs to a power stage 205. The power stage 205 has a single ended output node 203 that is connected to a single ended load 211, such as for example, analog speakers.

In the described embodiment, the attenuation circuit 202 includes a sense resistor divider $R_{sense}$ having a first terminal connected to the input line1 at a node 210 and a second terminal connected to the input line2 at a node 212. The attenuation circuit 202 also includes a resistor $R_5$ having one terminal connected to the node 210 and a second terminal connected to the node 203 as well as a resistor $R_4$ having one terminal connected to the node 212 and a second terminal connected to ground.

In the described embodiment, the attenuation circuit 202 further includes a voltage divider circuit 214 that, in the described embodiment, includes a resistor $R_1$ and a resistor $R_2$. As configured, the resistor $R_1$ has one terminal connected to the node 210 and a second terminal connected to an output node 215 of an attenuation operational amplifier 216. In a similar manner, the resistor $R_2$ has one terminal connected to the node 212 and a second terminal connected to the output node 215 of the attenuation operational amplifier 216. A tap line 218 connects a center portion of the sense resistor divider $R_{sense}$ to a first input node 220 of the attenuation operational amplifier 216 while a second input node 222 of the attenuation operational amplifier 216 is connected to a reference voltage supply $V_{ref}$.

During operation, the attenuation op amp 216 provides a virtual ground to the center portion of the sense resistor divider $R_{sense}$. By providing the virtual ground to the center portion of the sense resistor divider $R_{sense}$, the attenuation op amp 216 controls the common mode signal of the noise shaped differential amplifier 200. In this way, the inventive attenuation circuit 202 reduces the common mode feedback voltage swing of the noise shaped differential amplifier 200 as well as setting the common potential $V_{cm}$ developed at the input of the noise shaper 204.

Figure 1:
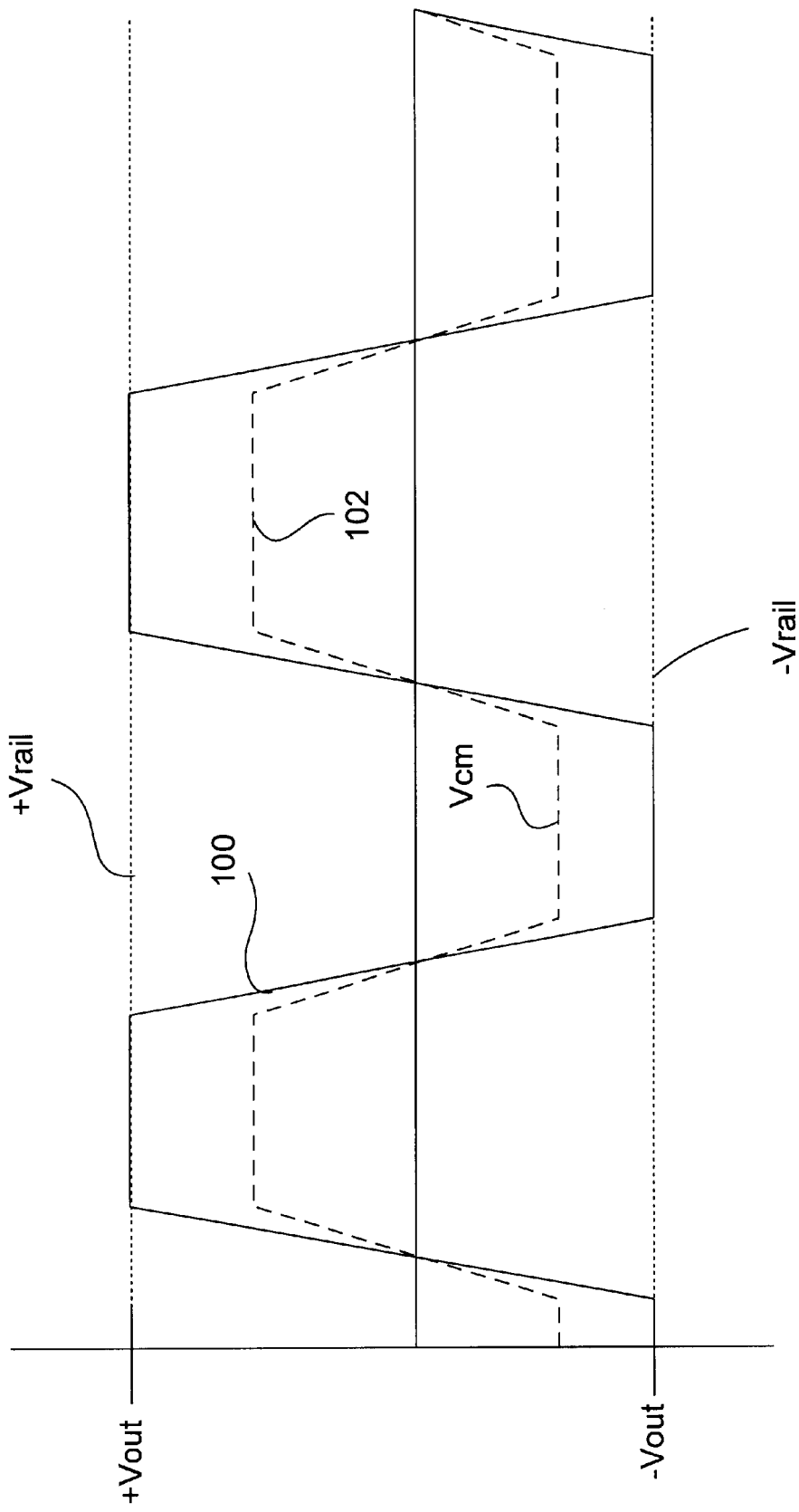
FIG. 1 shows an output signal with a common mode noise component from a conventional amplifier.
Figure 3A:
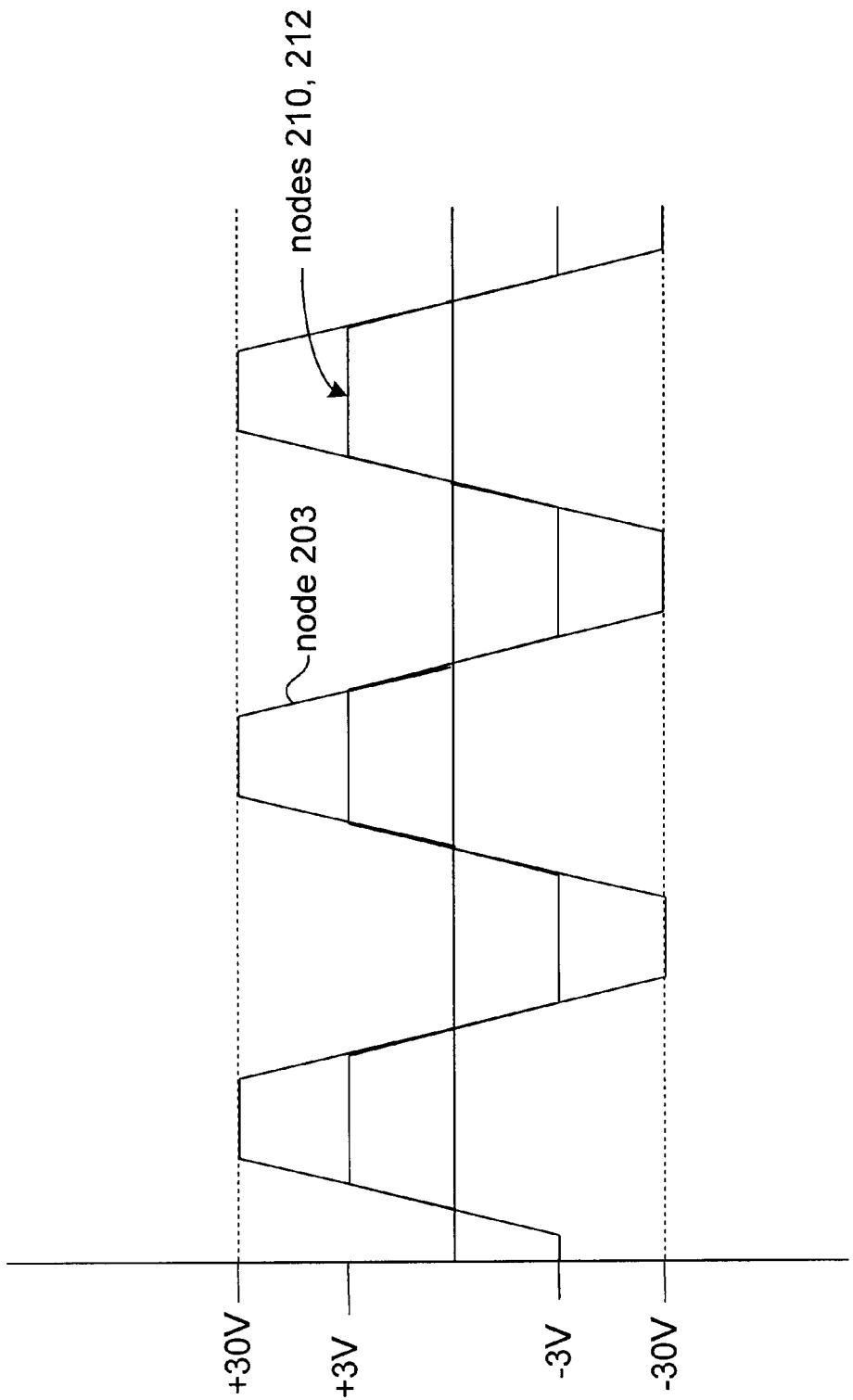
FIGS. 3A–3B compare the feedback voltages developed at nodes 210 and 212 of the amplifier shown in FIG. 2 as compared to a conventional amplifier.
Figure 3B:
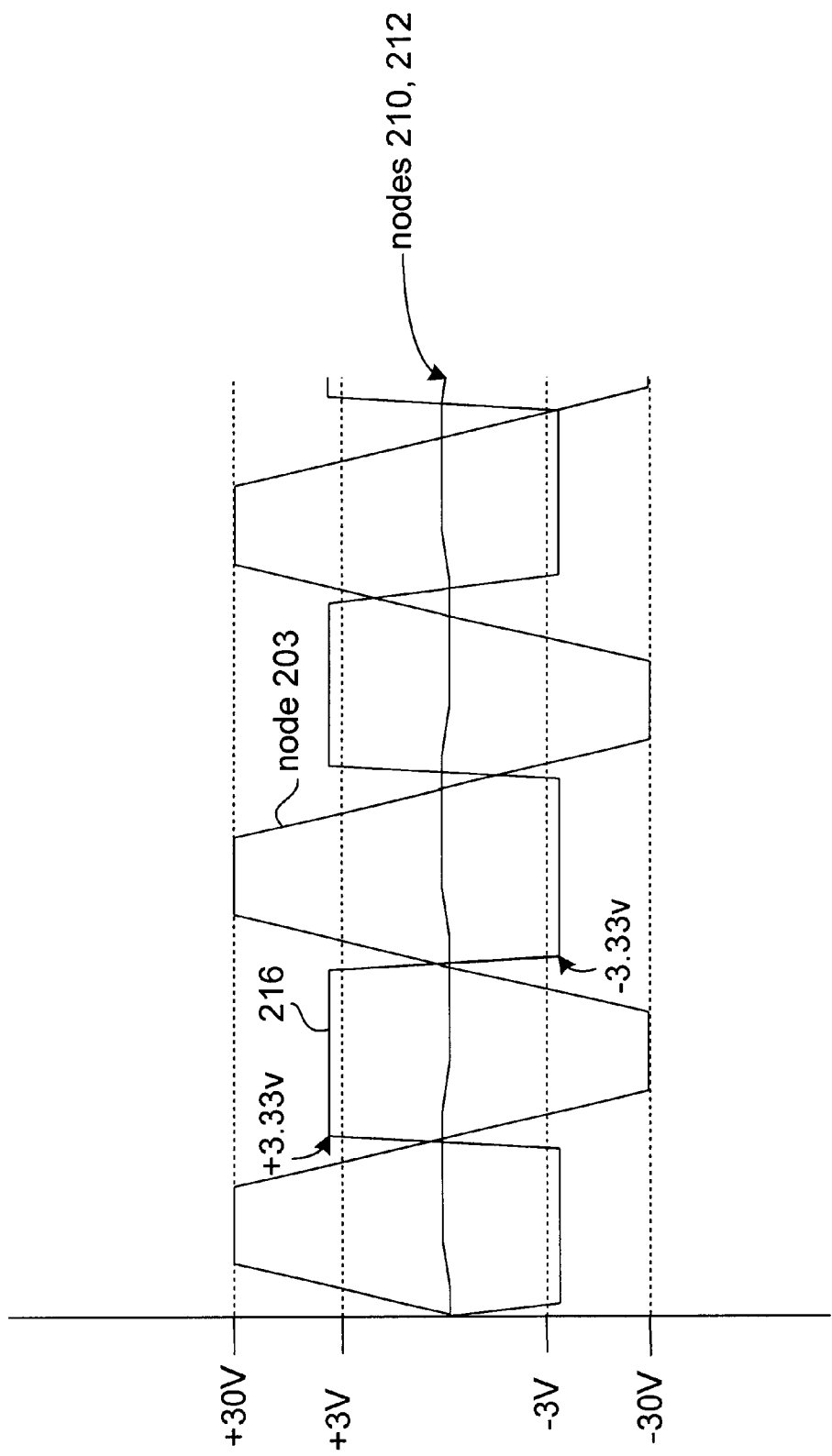

FIGS. 3A–3B compare the feedback voltages developed at nodes 210 and 212 of an amplifier similar to that shown in FIG. 2 having an attenuation circuit to that of a conventional amplifier used to generate the signal 100 of FIG. 1. It should be noted that this comparison is done assuming the noise shaper 204 has a virtual ground input. For example, for this comparison, it is assumed that the input to the noise shaper 204 is an RC integrator where the R of 'RC' is the Thevinin input resistance. It also assumes, for the purposes of comparison, that all resistor values are equal with the common node of $R_1$ and $R_2$ tied to ground (i.e., 0V). As compared to the conventional amplifier signal of FIG. 3A the signals shown in FIG. 3B (developed by the amplifier circuit of FIG. 2) illustrate that by substantially eliminating the common mode signal, the dynamic range of the amplifier 200 is substantially increased since by lowering its gain the corresponding noise gain is also lowered.

Although only a few embodiments of the present invention have been described, it should be understood that the present invention may be embodied in many other specific forms without departing from the spirit or the scope of the present invention.

Although the invention has been described in terms of a differential integrator, the described techniques work well for most noise shaper input and feedback components. Therefore, the present examples are to be considered as illustrative and not restrictive, and the invention is not to be limited to the details given herein, but may be modified within the scope of the appended claims along with their full scope of equivalents.

While this invention has been described in terms of a preferred embodiment, there are alterations, permutations, and equivalents that fall within the scope of this invention. It should also be noted that there are may alternative ways of implementing both the apparatus of the present invention. It is therefore intended that the invention be interpreted as including all such alterations, permutations, and equivalents as fall within the true spirit and scope of the present invention.

What is claimed is:

1. An attenuation circuit arranged to reduce a common mode potential in an amplifier having a noise shaper circuit, comprising:
   a sense resistor divider;
   a voltage divider circuit coupled to the sense resistor divider; and
   an attenuation operational amplifier (op amp) having,
      an output node connected to the voltage divider circuit,
      a first input node connected to a reference voltage supply (Vref), and
      a second input node connected to the sense resistor divider, wherein the attenuation op amp provides a virtual ground to a center of the sense resistor divider thereby setting a common mode potential Vcm developed at an input of the noise shaper and to reduce a common mode feedback voltage swing of the amplifier.

2. A circuit as recited in claim 1, wherein the attenuation circuit is coupled to the noise shaper having a first input node connected to a first input line and a first output line and a second input node connected to a second input line and a second output line.

3. A circuit as recited in claim 2, the sense resistor further comprises:
   a first sense resistor terminal connected to the first input line and the first output line at a first node, and a second sense resistor terminal connected to the second input line and the second output line at a second node.

4. A circuit as recited in claim 3, wherein the voltage divider circuit further comprises:
   a first resistor having a first resistor first terminal connected to the first node and a first resistor second terminal connected to the output node; and a second resistor having a second resistor first terminal connected to the second node and a second resistor second terminal connected to the output node.

5. A circuit as recited in claim 4, further comprising a single ended power stage having a power stage first input coupled to the first output line and a power stage second input coupled to the second output line and a power stage output line coupled to a load.

6. A common mode potential attenuation circuit as recited in claim 5, further comprising:
   a first input resistor connected in series between the first input node and the input voltage supply; and
   a second input resistor connected in series between the second input node and the input power supply.

7. A method for attenuating a common mode potential by a common mode potential attenuation circuit, comprising:
   providing a sense resistor divider;
   providing a voltage divider circuit; and
   providing an attenuation operational amplifier (op amp) having an output node, a attenuation op amp first input node, and a attenuation op amp second input node;
   connecting the attenuation op amp output node to the voltage divider circuit;
   connecting the attenuation op amp first input node to a reference voltage supply ($V_{ref}$), and
   connecting the attenuation op amp second input node to the sense resistor divider, wherein the attenuation op amp provides a virtual ground to a center of the sense resistor divider thereby setting a common mode potential $V_{cm}$ developed at an input of the noise shaper and to reduce a common mode feedback voltage swing of the amplifier.

8. A method as recited in claim 7, further comprising:
   coupling the attenuation circuit to the noise shaper having a first input node connected to a first input line and a first output line and a second input node connected to a second input line and a second output line.

9. A method as recited in claim 8, further comprising:
   connecting a first sense resistor terminal to the first input line and the first output line at a first node, and a second sense resistor terminal connected to the second input line and the second output line at a second node.

10. A method as recited in claim 9, further comprising:
    connecting a first resistor having a first resistor first terminal to the first node and a first resistor second terminal connected to the output node; and
    connecting a second resistor having a second resistor first terminal to the second node and a second resistor second terminal connected to the output node.

11. A method as recited in claim 10, further comprising:
    coupling a single ended power stage having a power stage first input to the first output line and a power stage second input coupled to the second output line and a power stage output line coupled to a load.

12. A method as recited in claim 11, further comprising:
    connecting a first input resistor in series between the first input node and the input voltage supply; and
    connecting a second input resistor in series between the second input node and the input power supply.

* * * * *